United States Patent [19]

Egami et al.

[11] Patent Number: 4,618,831
[45] Date of Patent: Oct. 21, 1986

[54] POWER AMPLIFYING APPARATUS

[75] Inventors: Shunichiro Egami, Yokosuka; Makoto Kawai, Yokohama, both of Japan

[73] Assignee: Nippon Telegraph & Telephone Corporation, Tokyo, Japan

[21] Appl. No.: 775,976

[22] Filed: Sep. 13, 1985

[30] Foreign Application Priority Data

Sep. 25, 1984 [JP] Japan .................................. 59-200959

[51] Int. Cl.$^4$ ............................................. H03F 3/68
[52] U.S. Cl. .................................. 330/124 R; 330/53; 330/124 D; 330/295; 333/117; 455/133; 455/140
[58] Field of Search ................. 330/53, 124 R, 124 D, 330/286, 287, 295, 147, 148; 333/117, 121; 455/133–140

[56] References Cited

U.S. PATENT DOCUMENTS 3,571,739 3/1971 Seidel ........................ 330/124 R X
3,731,217 5/1973 Gerst et al. ................... 333/117 X
4,477,781 10/1984 Reuss, Jr. .................. 330/124 R X

OTHER PUBLICATIONS

"The Butler Matrix Transponder", by W. A. Sandrin, COMSAT Tech. Review, vol. 4, No. 2, pp. 319–345, Fall 1974.

Primary Examiner—James B. Mullins
Attorney, Agent, or Firm—Pollock, Vande Sande and Priddy

[57] ABSTRACT

A first multi-port hybrid coupler is formed by $n2^{n-1}$ (where n is an integer equal to or greater than 2) hybrid couplers alone, which are divided into n stages, each including $2^{n-1}$ hybrid couplers. A signal input to any one of N $(=2^n)$ input terminals of the first stage is distributed equally to N output terminals of the nth stage. The N output terminals of the nth stage of the first multi-port hybrid coupler are connected to N amplifiers at the input side thereof, respectively, and the N amplifiers are connected at the output side to a second multi-port hybrid coupler. The second multi-port hybrid coupler is identical in construction with the first multi-port hybrid coupler, but its input terminals and output terminals are reverse from those of the latter and the input terminals of the second multi-port hybrid coupler are connected to the N amplifiers in an order reverse from the order of arrangement of the output terminals of the first multi-port hybrid coupler.

7 Claims, 18 Drawing Figures

POWER AMPLIFYING APPARATUS

BACKGROUND OF THE INVENTION

The present invention relates to a power amplifying apparatus which amplifies a plurality of signals through use of a plurality of amplifiers and is of great utility when employed in, for example, a transmitter of a communication satellite using a plurality of electromagnetic wave beams.

A satellite communication system permits the establishment of circuits, or communication channels in wide service areas, as required, and hence allows effective use of a small number of circuits by a large number of earth stations. Conventional satellite communication systems employ a single beam for transmission and reception, but a multi-beam satellite communication system employing a plurality of beams is now being proposed as a next-generation satellite communication system. This system covers a plurality of service areas $11_1$, $11_2$, $11_3$, ... on the earth by antenna beams $10_1$, $10_2$, $10_3$, ... from a communication satellite 100, respectively, as shown in FIG. 1. With this multi-beam system, it is possible to increase the satellite antenna gain and to use the same frequency, and accordingly an increase in the transmission capacity or miniaturization of an earth station can be expected.

In such a multi-beam system, a power amplifying apparatus for supplying transmitting power to transmitting antennas $9_1$, $9_2$, $9_3$, ... for the beams $10_1$, $10_2$, $10_3$, ... has such an arrangement as depicted in FIG. 1. Input terminals $1_1$ to $1_n$ are respectively connected to input sides of power amplifiers (hereinafter referred to simply as amplifiers) $2_1$ and to $2_n$ each of a maximum transmission output P. The output sides of the amplifiers $2_1$ to $2_n$ are connected to output terminals $3_1$ to $3_n$, respectively. Input signals to the input terminals $1_1$ to $1_n$ are individually amplified by the amplifiers $2_1$ to $2_n$ and delivered to the output terminals $3_1$ to $3_n$.

In this amplifying apparatus, the transmission output at each output terminal is limited by the output P of each of the amplifiers $2_1$ to $2_n$. That is to say, the path between each input terminal and the corresponding output terminal is constructed completely independently of the other paths. On account of this, for instance, even if the amplifier $2_1$ has a margin in its power amplification capacity for the signal which is applied thereto from the input terminal $1_1$ and amplified thereby for output to the output terminal $3_1$, the margin cannot be used for signals which are provided to the other output terminals.

In multi-beam satellite communication, the number of carriers which each beam transmits varies with the amount of communication traffic in each of the service areas $11_1$, $11_2$, $11_3$, ... ; therefore, it is necessary that each of the amplifiers $2_1$, $2_2$, ... for the beams $10_1$, $10_2$, ... have a power amplification capacity large enough to sufficiently amplify the input signal when it is assigned the largest number of carriers. To meet this requirement, an expensive amplifier of a large power capacity must be prepared for each beam, but when the number of carriers assigned to the input signal is small, such capacity of the amplifier is not effectively utilized. Furthermore, even in the case where the amplifier has a margin in its output but another amplifier wants more output, the surplus power cannot be assigned to the beam of insufficient power.

In view of the above, there has been proposed by W. A. Sandrin a system in which an input signal for each beam is equally distributed to a plurality of amplifiers, and then the amplified signals are combined into signals for the respective beams for output as the corresponding antenna beams ("The Butler matrix transponder", COMSAT Tech. Review, Vol. 4, No. 2, pp. 319-345, Fall 1974). In this system, a Butler matrix circuit is disposed between a plurality of input terminals corresponding to the respective beams and the input sides of a plurality of amplifiers and another Butler matrix circuit is disposed between the output sides of the amplifiers and feeding points for the respective beams. The Butler matrix circuits on the input and output sides are each made up of 90° hybrid couplers and fixed phase shifters. A required amount of phase shift by each fixed phase shifter varies with the number of amplifiers used, but when four amplifiers are used, the phase shift is an integral multiple of 45°. Such a phase shifter is formed by a transmission line and the phase shift is dependent upon the length of the transmission line. Therefore, a desired phase shift is obtainable at only one frequency, so a wide-band characteristic cannot be obtained. Moreover, an increase in the number of amplifiers used causes an increase in the number of fixed phase shifters, and the above system is difficult to implement when the number of amplifiers used is as many as 16 or more.

Furthermore, what is called a balanced amplifier has been proposed with a view to effectively utilizing amplifiers in two signal systems. As illustrated in FIG. 2, the input terminals $1_1$ and $1_2$ are connected to two input terminals of a 90° hybrid coupler 121, respectively, which has its two output terminals connected via the amplifiers $2_1$ and $2_2$ to two input terminals of another 90° hybrid coupler 122, the two output terminals of which are, in turn, connected to the output terminals $3_1$ and $3_2$. Letting the amplification gain of each of the amplifiers $2_1$ and $2_2$ be represented by a, an input signal $P_1$ to the input terminal $1_1$ is divided by the hybrid coupler 121 into two equal signals, which are respectively amplified by the amplifiers $2_1$ and $2_2$, and the amplified outputs are combined by the hybrid coupler 122 into a composite signal, which is delivered as a.$P_1$ at the output terminal $3_2$, but no output is obtained at the output terminal $3_1$. Similarly, a signal $P_2$ input to the input terminal $1_2$ is amplified to a.$P_2$ and output to the output terminal $3_1$ but is not delivered to the output terminal $3_2$.

In this balanced amplifier, when differences in the gain and the phase shift arise between the amplifiers $2_1$ and $2_2$, the component of the signal $P_1$ will appear at the output terminal $3_1$, degrading isolation (crosstalk). Besides, even a slight difference in either the gain or phase shift between the amplifiers $2_1$ and $2_2$ will greatly deteriorate the isolation, and a failure of one of them will lead to marked reduction of the output and degradation of the isolation, making the balanced amplifier inoperable.

SUMMARY OF THE INVENTION

It is therefore an object of the present invention to provide a power amplifying apparatus in which signals to a plurality of input terminals, which are to be individually provided to a plurality of output terminals, share the sum of the output power capacities of a plurality of amplifiers, thereby ensuring effective utilization of the overall output capacity of the apparatus.

Another object of the present invention is to provide a power amplifying apparatus in which signals to a plurality of input terminals, which are to be individually provided to a plurality of output terminals, share the sum of the output capacities of a plurality of amplifiers, and in which the apparatus operates over a wide band.

Yet another object of the present invention is to provide a power amplifying apparatus in which signals to a plurality of input terminals, which are to be individually provided to a plurality of output terminals, share the sum of the output capacities of a plurality of amplifiers.

In accordance with an aspect of the present invention, N (where $N=2^n$, n being an integer equal to or greater than 2) amplifiers are respectively connected at the input side thereof to N output terminals of a first multi-port hybrid coupler having N input terminals and at the output side thereof to N input terminals of a second multi-port hybrid coupler having N output terminals. The first multi-port hybrid coupler is formed unequivocally by n cascade-connected stages of hybrid couplers alone, each stage consisting of $2^{n-1}$ hybrid couplers, and a signal input to each input terminal of the multi-port hybrid coupler is divided into N signals of equal power for output to all (N) output terminals. The second multi-port hybrid coupler is also identical in construction with the first multi-port hybrid coupler. A signal input to one input terminal is distributed equally by the first multi-port hybrid coupler to N amplifiers and their amplified outputs are combined by the second multi-port hybrid coupler into one, which is delivered to one output terminal. Similarly, a signal input to another input terminal is distributed to and amplified by the N amplifiers, thereafter being combined by the second multi-port hybrid coupler for output to another output terminal.

Of the N input terminals of the first multi-port hybrid coupler, only M (where M is smaller than N) input terminals can be used as input terminals of the power amplifying apparatus, and corresponding M output terminals of the N output terminals of the second multi-port hybrid coupler are used as output terminals of the power amplifying apparatus. Dummy loads are respectively connected to unused input and output terminals. Also, the hybrid couplers which do not participate in signal transmission can be omitted. Thus a power amplifying apparatus can be constituted which has the M input terminals and M output terminals.

In accordance with another aspect of the present invention, one phase shifter is connected in series to each of N amplifiers and its phase shift is selectively controlled to 0 or $\pi$ so that the relationship of correspondence between the input terminals and the output terminals of the power amplifying apparatus can be interchanged.

DESCRIPTION OF THE PREFERRED EMBODIMENTS

First Embodiment (N inputs, N outputs, N amplifiers)

Figure 1:
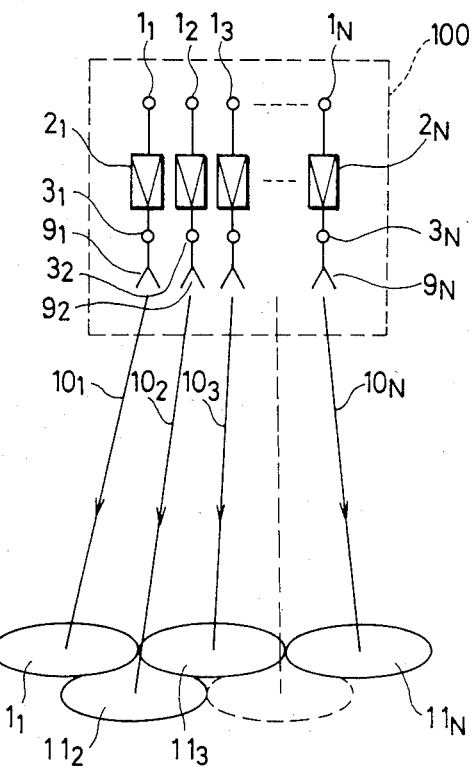
FIG. 1 is a schematic diagram showing a prior art multi-beam satellite communication system.
Figure 3:
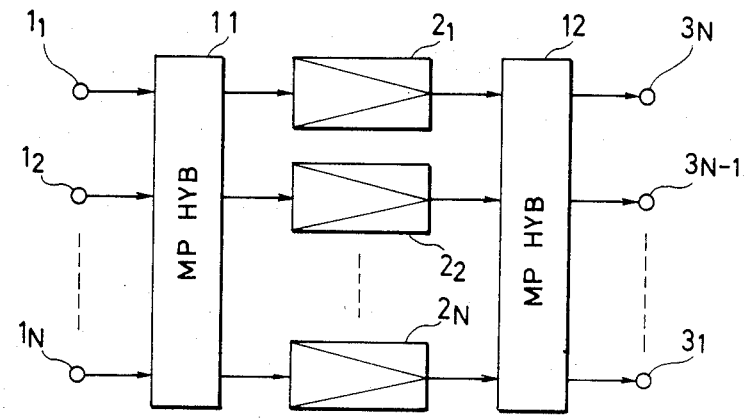
FIG. 3 is a block diagram illustrating a first embodiment (N inputs, N outputs and N amplifiers) of the power amplifying apparatus of the present invention.

FIG. 3 illustrates an embodiment of the present invention, in which the parts corresponding to those in FIG. 1 are identified by the same reference numerals. In this embodiment a multi-port hybrid coupler 11 is connected between the input terminals $1_1$ and $1_N$ and the amplifiers $2_1$ and $2_N$ (where $N=2^n$, n being an integer equal to or greater than 2) and another multi-port hybrid coupler 12 is connected between the amplifiers $2_1$ to $2_N$ and the output terminals $3_1$ and $3_N$. The multi-port hybrid couplers 11 and 12 are each formed by hybrid couplers alone and have the function that always divides input power from an arbitrary input terminal into N equal signals for output to N output terminals.

With the illustrated arrangement, a signal from one input terminal, for instance, $1_1$, is divided by the multi-port hybrid coupler 11 into N signals of equal power, which are respectively amplified by the amplifiers $2_1$ to $2_N$, and the amplified outputs are combined by the multi-port hybrid coupler 12 into one for output to one output terminal $3_1$.

A signal from another input terminal is also similarly divided by the multi-port hybrid coupler 11 into N signals of equal power, the N divided signals are amplified by the amplifiers $2_1$ to $2_N$ and then combined by the multi-port hybrid coupler 12 into one, which is provided to one output terminal corresponding to the input terminal to which the input signal was applied.

Accordingly, any one of the output terminals $3_1$ to $3_N$ is capable of delivering therefrom a variable output power provided that a total sum of output powers obtainable from all the output terminals $3_1$ to $3_N$ does not exceed the sum of output power capacities of the all amplifiers $2_1$ to $2_N$. This capability can be regarded, in terms of the prior art separate amplifying channels shown in FIG. 1, as if surplus power capacities of amplifiers in the lower traffic channels could be allotted to the amplifier in the heaviest traffic channels.

Next, in order to facilitate a better understanding of the above operation, a general description will be given first of the properties of hybrid couplers.

(a) 4-Input, 4-Output Hybrid Coupler

Figure 4A:
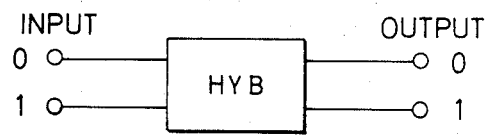
FIG. 4A is a diagram showing a hybrid coupler.
Figure 4B:
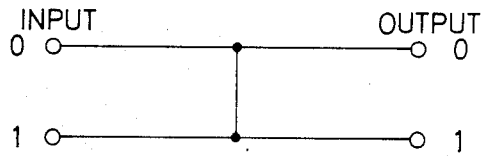
FIG. 4B is a diagrammatic symbol of the hybrid coupler depicted in FIG. 4A.
Figure 5A:
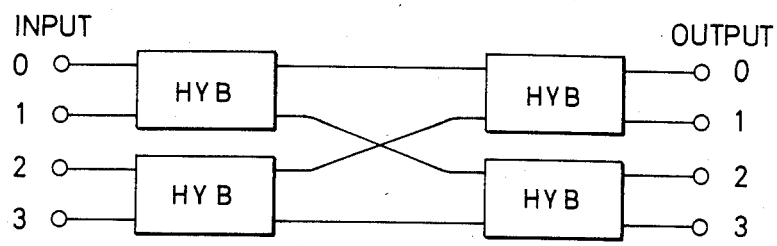
FIG. 5A is a diagram showing a multi-port hybrid coupler with four inputs and four outputs which is formed using four hybrid couplers.
Figure 5B:
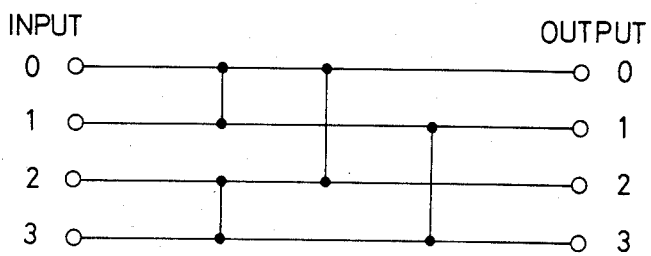
FIG. 5B shows a diagrammatic symbol of the multi-port hybrid coupler depicted in FIG. 5A.

FIG. 4A shows a single hybrid coupler. For convenience of illustration, the insertion of a hybrid coupler will hereinafter be represented by a vertical solid line, as shown in FIG. 4B. For example, a multi-port hybrid coupler composed of four hybrid couplers and having four input terminals and four output terminals (FIG. 5A) is represented in such a form as shown in FIG. 5B. In the following description, terminals will be identified by consecutive numbers assigned thereto and a hybrid coupler with input terminals a and b and output terminals a and b will be represented by [a, b].

Figure 6A:
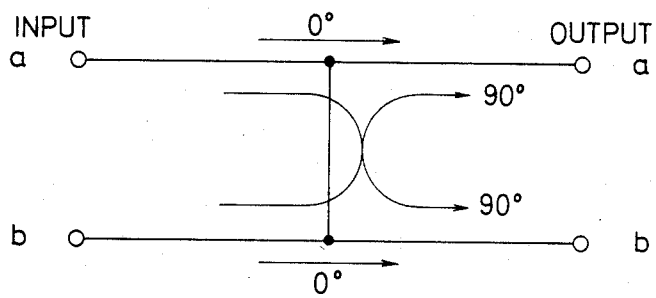
FIG. 6A is a diagram showing the input-output coupling state of a coupler-type hybrid coupler (a 90° hybrid coupler), along with its diagrammatic symbol.
Figure 6B:
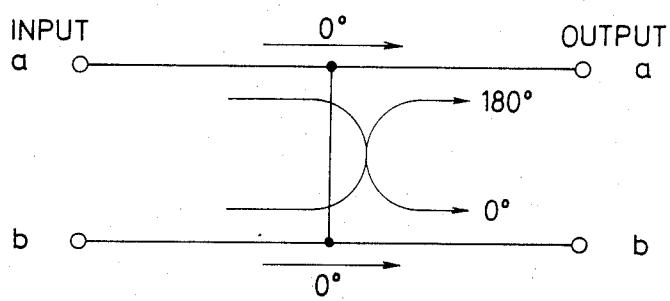
FIG. 6B is a diagram showing the input-output coupling state of a magic T hybrid coupler (a 180° hybrid coupler), along with its diagrammatic symbol.

Hybrid couplers are classified into a coupler type hybrid coupler, i.e. a 90° hybrid coupler (90° HYB) and a magic T hybrid coupler, i.e. a 180° hybrid coupler (180° HYB). With the coupler type hybrid coupler, as shown in FIG. 6A, an input signal from the input terminal "a" is divided into two equal signals phased +90° (or −90°) apart from each other, which are provided to the output terminals "a" and "b", respectively. An input signal from the input terminal "b" is divided into two equal signals displaced −90° (or +90°) apart from each other in phase, which are applied to the output terminals "a" and "b", respectively. With the magic T hybrid coupler, as shown in FIG. 6B an input signal from the input terminal "a" is divided into two equal signals in phase with each other (or having a 180° phase difference), which are applied to the output terminals "a" and "b", respectively. An input signal from the input terminal "b" is divided into two equal signals phased 180° apart (or in phase with each other), which are provided to the output terminals "a" and "b", respectively.

(b) N-Terminal Multi-Port Hybrid Coupler

Figure 7:
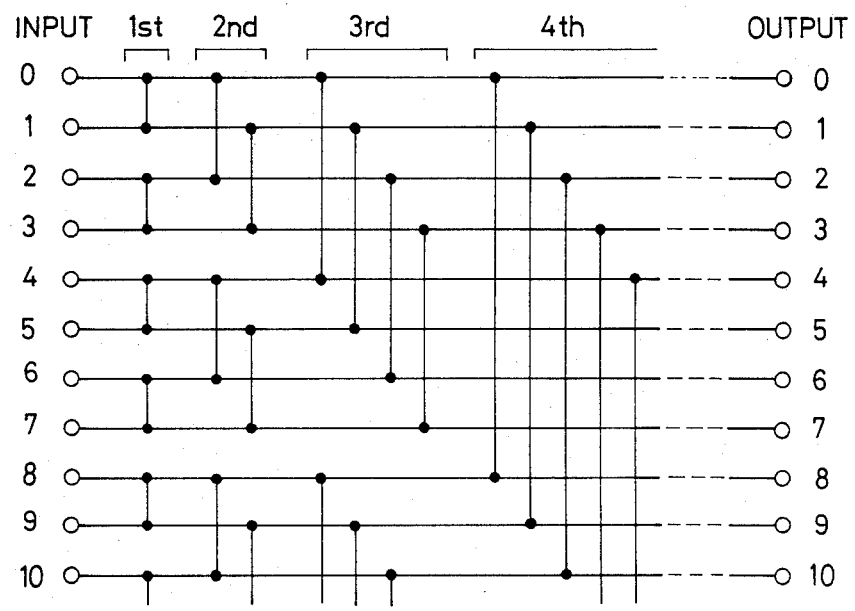
FIG. 7 is a schematic diagram illustrating the general arrangement of a multi-port hybrid coupler.

FIG. 7 illustrates, by the symbol depicted in FIG. 4B, the N-terminal (where $N=2^n$, n being an integer equal to or greater than 2) multi-port hybrid couplers 11 and 12 shown in FIG. 3. The hybrid couplers used in this case may be either 90° or 180° hybrid couplers alone.

In FIG. 7, each multi-port hybrid coupler comprises n stages of hybrid couplers, each stage including $2^{n-1}$ hybrid couplers. The hybrid couplers of a first stage couple adjacent signal lines, the hybrid couplers of a second stage couple every other signal lines, the hybrid couplers of a third stage couple every fourth signal lines, and the hybrid couplers of an i−th stage couple every $2^{i-1}-1$ signals lines. The number $a_N$ of the hybrid couplers needed in this case is given by $$a_N = n2^{n-1} \quad (1)$$

The arrangement of this multi-port hybrid coupler will be described in more detail. A multi-port hybrid coupler with N (where $N=2^n$, n being an integer equal to or greater than 2) input terminals and N output terminals is made up of n cascade-connected stages of hybrid couplers, each stage including N/2 ($=2^{n-1}$) hybrid couplers. Now, output terminals of the first-stage hybrid couplers are given numbers [2k, 2k+1] (where k=0, 1, ... and $2^{n-1}-1$), that is, [0, 1], [2, 3], [4, 5], ...; output terminals of the second-stage hybrid couplers are given numbers [$4k_1+k_2$, $4k_1+k_2+2$] (where $k_1=0, 1, ..., 2^{n-2}-1$ and $k_2=0, 1$), that is, [0, 2], [1, 3], [4, 6], ...; and output terminals of the ith-stage hybrid couplers are given numbers [$2^i k_1+k_2$, $2^i k_1+k_2+2^{i-1}$] (where $k_1=0, 1, ..., 2^{n-i}-1$ and $k_2=0, 1, ..., 2^{i-1}-1$), that is, [0, $2^{i-1}$], [1, $1+2^{i-1}$], [$2^i$, $2^i+2^{i-1}$], .... In a similar manner, input terminals of the hybrid couplers of the respective stages are numbered. Adjacent stages are interconnected by connecting the output terminals of the preceding stage and the input terminals of the succeeding stage which have the corresponding numbers. The input terminals of the N/2 hybrid couplers of the first stage and the output terminals of the N/2 hybrid couplers of the final stage are used as the input terminals and output terminals of the multi-port hybrid coupler.

Now, let the relationship between an input voltage $E_{ih}$ at an input terminal h and an output voltage $E_{ok}$ at an output terminal k in the multi-port hybrid coupler with N ($=2^n$) terminals shown in FIG. 7 be represented by $$E_{ok} = T^{(n)}_{kh} E_{ih} \quad (2)$$

using a transfer matrix $$\{T^{(n)}_{kh}\}$$

(h=0, ... $2^{n-1}-1$, k=0, ... $2^{n-1}$)}. In the case of employing 90° hybrid couplers, when n=1, the abovesaid relationship is given by virtue of its characteristic, as follows:

$$T^{(1)}_{kh} = \begin{cases} \dfrac{1}{\sqrt{2}} & \text{for } h \neq k \ (h = 0, 1, k = 0, 1) \\ \dfrac{j}{\sqrt{2}} & \end{cases} \quad (3)$$

That is, $$\begin{pmatrix} E_{o0} \\ E_{o1} \end{pmatrix} = \frac{1}{\sqrt{2}} \begin{pmatrix} 1 & j \\ j & 1 \end{pmatrix} \begin{pmatrix} E_{i0} \\ E_{i1} \end{pmatrix} \quad (4)$$

When $n = 2$, $$T^{(2)}_{kh} = \begin{cases} \dfrac{1}{2} & \text{for } h = k \\ \dfrac{j}{2} & \text{for } \begin{aligned}(h &= 0, 3, k = 1, 2)\\(h &= 1, 2, k = 0, 3)\end{aligned} \\ & \quad (h = 0, k = 3), (h = 1, k = 2) \\ -\dfrac{1}{2} & \text{for } (h = 2, k = 1), (h = 3, k = 0) \\ & \quad (h = 0, 1, 2, 3, k = 0, 1, 2, 3) \end{cases} \quad (5)$$

$$\begin{pmatrix} E_{o0} \\ E_{o1} \\ E_{o2} \\ E_{o3} \end{pmatrix} = \frac{1}{\sqrt{2}} \begin{pmatrix} T_1 & jT_1 \\ jT_1 & T_1 \end{pmatrix} \begin{pmatrix} E_{i0} \\ E_{i1} \\ E_{i2} \\ E_{i3} \end{pmatrix} \quad (6)$$

$$T_1 = \frac{1}{\sqrt{2}} \begin{pmatrix} 1 & j \\ j & 1 \end{pmatrix} \quad (7)$$

Now, letting h and k be represented by binary terms $r_i$ and $s_i$ which take only a "0" or "1", as follows:

$$h = r_0 + r_1 2 + r_2 2^2 + \ldots \atop k = s_0 + s_1 2 + s_2 2^2 + \ldots \Big\} \quad (8)$$

then Eqs. (3) and (5) can be rewritten as follows:

$$T_{kh}^{(1)} = \frac{1}{\sqrt{2}} \exp\left[ j \frac{\pi}{2} r_0 \oplus s_0 \right] \quad (9)$$

$$T_{kh}^{(2)} = \frac{1}{\sqrt{2}} \exp\left[ j \frac{\pi}{2} (r_0 \oplus s_0 + r_1 \oplus s_1) \right] \quad (10)$$

where $\oplus$ indicates an exclusive OR and $$r \oplus s = \begin{cases} 0 \text{ for } r = s \\ 1 \text{ for } r \neq s \end{cases} \quad (11)$$

For $N = 2^n$ shown in FIG. 7, however, Eqs. (9) and (10) become $$T_{kh}^{(n)} = \frac{1}{\sqrt{N}} \exp\left[ j \frac{\pi}{2} \sum_{i=0}^{n-1} r_i \oplus s_i \right] \quad (12)$$

$(h = 0, 1, \ldots, 2^{n-1}, k = 0, 1, \ldots, 2^{n-1})$ $$\begin{pmatrix} E_{o0} \\ E_{o1} \\ \cdot \\ \cdot \\ E_{on-1} \end{pmatrix} = \frac{1}{\sqrt{2}} \begin{pmatrix} T_{n-1} & jT_{n-1} \\ jT_{n-1} & T_{n-1} \end{pmatrix} \begin{pmatrix} E_{i0} \\ E_{i1} \\ \cdot \\ \cdot \\ E_{in-1} \end{pmatrix} \quad (13)$$

Similarly, in the case of using 180° hybrid couplers, the aforementioned relationship can be expressed by $$T_{kh}^{(n)} = \frac{1}{\sqrt{N}} \exp\left[ j\pi \sum_{i=0}^{n-1} r_i \wedge \overline{s_i} \right] \quad (14)$$

$(h = 0, 1, \ldots, 2^{n-1}, k = 0, 1, \ldots, 2^{n-1})$ where $\wedge$ indicates a logical product and $-$ negation.

(c) N-Input, N-Output Amplifying Apparatus

The input-output relation in the embodiment shown in FIG. 3, obtained by the above equations, are as follows: Letting $E_m$ (where $m = 0, \ldots, N-1$) stand for the input voltage at a terminal m of the multi-port hybrid coupler 11, $T_{hm}^{(n)}$ stand for the transfer coefficient between input terminals m and output terminals of the multi-port hybrid couplers 11 and 12 and a stand for the voltage amplification degree of each of the amplifiers $2_1$ to $2_N$, the output voltage at the output terminal k of the multi-port hybrid coupler 12 for the input voltage $E_m$ is given by $$E_{mk} = aE_m \sum_{h=0}^{N-1} T_{kh}^{(n)} T_{hm}^{(n)} \quad (15)$$

Accordingly, the output power $P_{mk}$ at the terminal k at that time is given by $$P_{mk} = a^2 P_m \left| \sum_{h=0}^{N-1} T_{kh}^{(n)} T_{hm}^{(n)} \right|^2 \quad (16)$$

where $P_m$ indicates the input power to the terminal m. Assuming that the 90° hybrid couplers are used, the substitution of Eq. (12) into Eq. (16) gives $$P_{mk} = \frac{a^2 P_m}{N^2} \left| \sum_{h=0}^{N-1} \exp\left[ j \frac{\pi}{2} \sum_{i=0}^{n-1} (r_i \oplus s_i + r_i \oplus t_i) \right] \right|^2 \quad (17)$$

For $t_i$ which takes only a "0" or "1", $$m = t_0 + t_1 2 + t_2 2^2 + \ldots \quad (18)$$

Taking into account the property of the binary number in Eq. (17), it becomes as follows:

$$P_{mk} = \begin{cases} a^2 P_m \text{ for } s_i = \overline{t_i} \\ 0 \text{ for } s_i \neq \overline{t_i} \end{cases} \quad (19)$$

Figure 2:
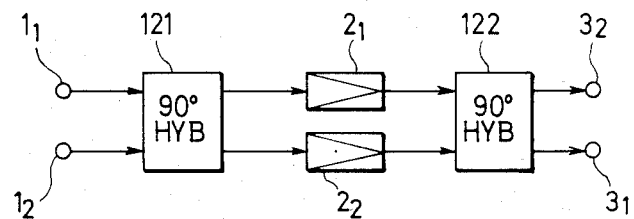
FIG. 2 is a block diagram illustrating a conventional balanced amplifier.

That is to say, a signal input from one m $(= t_0 + t_1 2 + t_2 2^2 + \ldots)$ of the input terminals $1_1$ to $1_N$ is distributed to and amplified by the N amplifiers $2_1$ to $2_N$, thereafter being derived at one k $(= \overline{t_0} + \overline{t_1} 2 + \ldots)$ of the output terminals $3_1$ to $3_N$. In the example shown in FIG. 3, when $N = 2$, its arrangement is identical with that of the conventional balanced amplifier depicted in FIG. 2. The relation between the input and the output signal in this instance becomes from Eqs. (4) and (7) as follows:

$$\begin{pmatrix} P_0 \\ P_1 \end{pmatrix} = aT_1 T_1 \begin{pmatrix} E_0 \\ E_1 \end{pmatrix} = \frac{a}{2} \begin{pmatrix} 1 & j \\ j & -1 \end{pmatrix} \begin{pmatrix} 1 & j \\ j & 1 \end{pmatrix} \begin{pmatrix} E_0 \\ E_1 \end{pmatrix} = \quad (20)$$

$$ja \begin{pmatrix} 0 & 1 \\ 1 & 0 \end{pmatrix} \begin{pmatrix} E_0 \\ E_1 \end{pmatrix}$$

Figure 8:
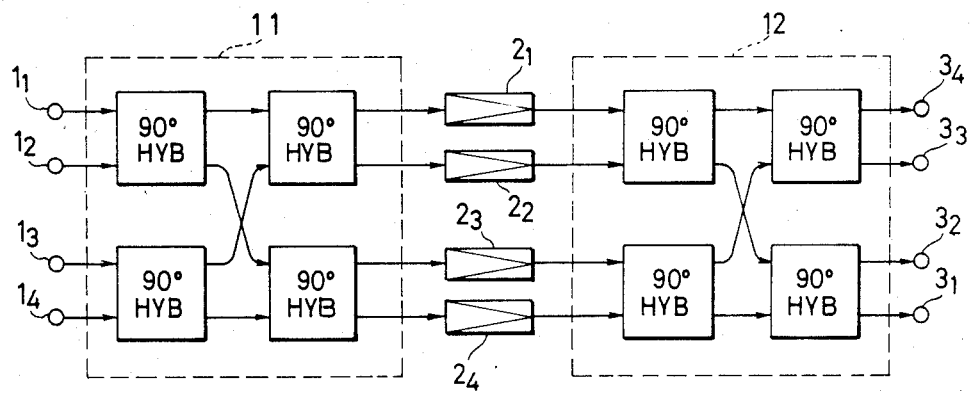
FIG. 8 is a block diagram illustrating this invention apparatus with four inputs, four outputs and four amplifiers.

When $N = 4$, the arrangement becomes such as shown in FIG. 8, and the relation between the input and output in this case is as follows:

$$\begin{pmatrix} P_0 \\ P_1 \\ P_2 \\ P_3 \end{pmatrix} = aT_2 T_2 \begin{pmatrix} E_0 \\ E_1 \\ E_2 \\ E_3 \end{pmatrix} = \frac{a}{\sqrt{2}} \begin{pmatrix} T_1 & jT_1 \\ jT_1 & T_1 \end{pmatrix} \begin{pmatrix} T_1 & jT_1 \\ jT_1 & T_1 \end{pmatrix} \begin{pmatrix} E_0 \\ E_1 \\ E_2 \\ E_3 \end{pmatrix} = \quad (21)$$

$$-a \begin{pmatrix} 0 & 0 & 0 & 1 \\ 0 & 0 & 1 & 0 \\ 0 & 1 & 0 & 0 \\ 1 & 0 & 0 & 0 \end{pmatrix} \begin{pmatrix} E_0 \\ E_1 \\ E_2 \\ E_3 \end{pmatrix}$$

Figure 9:
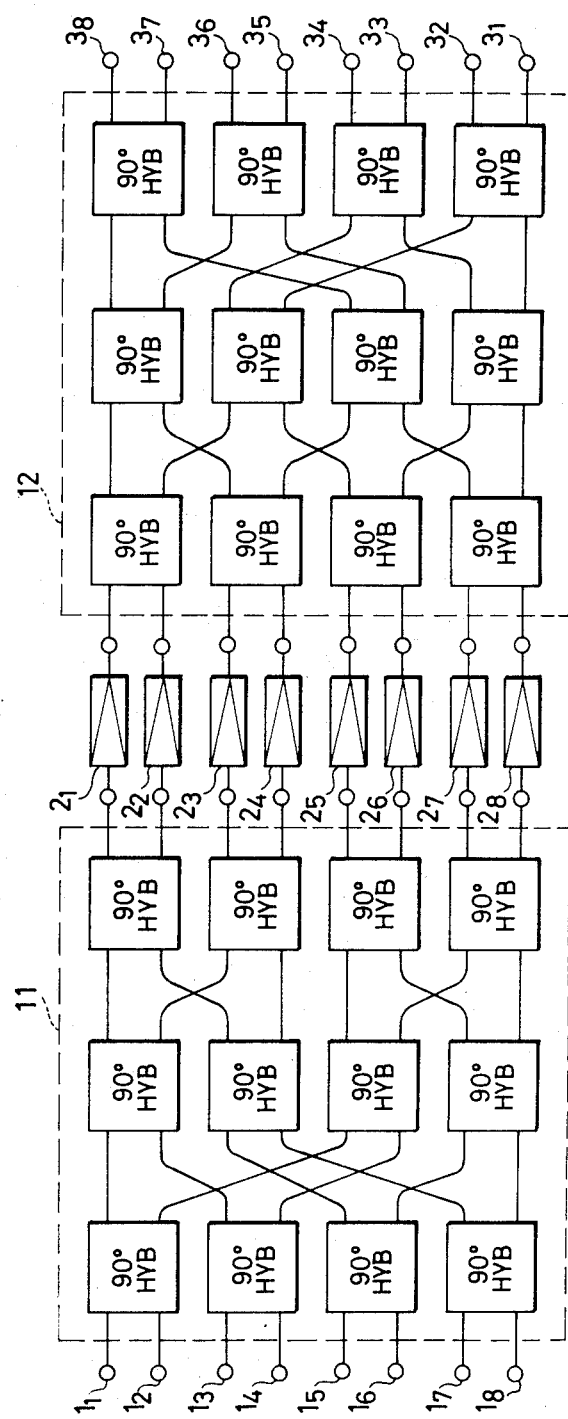
FIG. 9 is a block diagram illustrating this invention apparatus with eight inputs, eight outputs and eight amplifiers.

Similarly, in the case of $N = 8$, the arrangement is such as shown in FIG. 9, and the input-output relation is as follows:

$$\begin{pmatrix} P_0 \\ P_1 \\ \vdots \\ P_7 \end{pmatrix} = aT_3T_3 \begin{pmatrix} E_0 \\ E_1 \\ \vdots \\ E_7 \end{pmatrix} = ja \begin{pmatrix} 0 & \ldots & 0 & 1 \\ 0 & & 1 & 0 \\ \vdots & & & \vdots \\ 0 & & & \vdots \\ 1 & 0 & \ldots & 0 \end{pmatrix} \quad (22)$$

In general, letting complex amplitude gains of the amplifiers $2_1$ to $2_N$ be represented by $a_1$ to $a_N$ and a matrix $A_n$ be represented by $$A_n = \begin{pmatrix} a_1 & 0 & \ldots & 0 \\ 0 & a_2 & & \vdots \\ \vdots & & \ddots & \vdots \\ 0 & \ldots & & a_N \end{pmatrix} \quad (23)$$

the relation between input and output vectors $|E$ and $|P$ is given by the following equation:

$$|P = T_n \cdot A_n \cdot T_n \cdot |E \quad (24)$$

Eqs. (20) to (24) also show that signals input from the input terminals $1_1$ to $1_N$ are each equally distributed to and amplified by the amplifiers and the amplified outputs are combined into one signal for output to the corresponding one of the output terminals $3_1$ to $3_N$. In the 90° hybrid coupler a signal input to one of its input terminals is divided into two equal signals, but they are displaced 90° apart from each other in phase. For example, a signal input to the input terminal $1_1$ is divided into N equal signals and they are amplified by the amplifiers $2_1$ to $2_N$, and the N amplified outputs are added together for the output terminal $3_1$, but for the other output terminals $3_2$ to $3_N$, they are out of phase with one another and cancelled, and hence are not provided to the output terminals $3_2$ to $3_N$. Therefore, it is necessary that the gains and the phase shifts of the amplifiers $2_1$ to $2_N$ be equal to one another.

(d) Influences of Deviations of Gain and Phase Shifts of Amplifiers

If the N amplifiers $2_1$ to $2_N$ have an equal gain and an equal phase shift, then the power combining characteristic at each of the output terminals $3_1$ to $3_N$ and the isolation characteristics at the output terminal with respect to the other output terminals are determined by the characteristics of the multi-port hybrid couplers 11 and 12. The 90° hybrid coupler has excellent coupling, phase shift and isolation characteristics over a wide band. The most important problem for implementing the power amplifying apparatus of the present invention is the equality of the gain and the phase shift among the amplifiers $2_1$ to $2_N$. Now, a description will be given of the influences of unequal gains and phase shifts of the amplifiers $2_1$ to $2_N$.

Letting the gain and the amount of phase shift of each amplifier $2_i$ be represented by $a_i$ and $\theta_i$, mean values of the gain and the amount of phase shift be represented by $a_0$ and $\theta_0$ and deviations of the gain and the phase shift from their mean values be represented by $\Delta_i$ and $\delta_i$, the gain $a_i$ and the phase shift $\theta_i$ are expressed as follows:

$$a_i = a_0(1+\Delta_i), \text{ where } i=1 \text{ to } N \quad (25)$$

$$\theta_i = \theta_o + \delta_i, \text{ where } i=1 \text{ to } N \quad (26)$$

where:

$$\left. \begin{array}{l} \sum_{i=1}^{N} \Delta_i = 0 \\ \sum_{i=1}^{N} \delta_i = 0 \end{array} \right\} \quad (27)$$

Furthermore, $\Delta$ and $\delta$ are defined as mean gain variation (standard deviations of gain) and mean phase variation (standard deviation of phase shift), as follows:

$$\Delta = \left( \sum_{i=1}^{N} \Delta_i^2/N \right)^{\frac{1}{2}} \quad (28)$$

$$\delta = \left( \sum_{i=1}^{N} \delta_i^2/N \right)^{\frac{1}{2}}$$

Letting the sum of the outputs of the N amplifiers $2_1$ to $2_N$ be represented by $P_0$, the combined output of a desired signal for a certain output terminal (a combined output terminal) be represented by $P_{out}$, the combining efficiency $P_{out}/P_0$ is given from Eq. (24) as follows:

$$P_{out}/P_0 = 1 - [(N-1)/N](\Delta^2 + \delta^2) \quad (29)$$

Similarly, if the outputs of the other output terminals (isolated terminals) be represented by $P_{iso}$ the isolation $P_{iso}/P_0$ of the isolated terminals is given as follows:

$$P_{iso}/P_0 = (1/N)(\Delta^2 + \delta^2) \quad (30)$$

Figure 10:
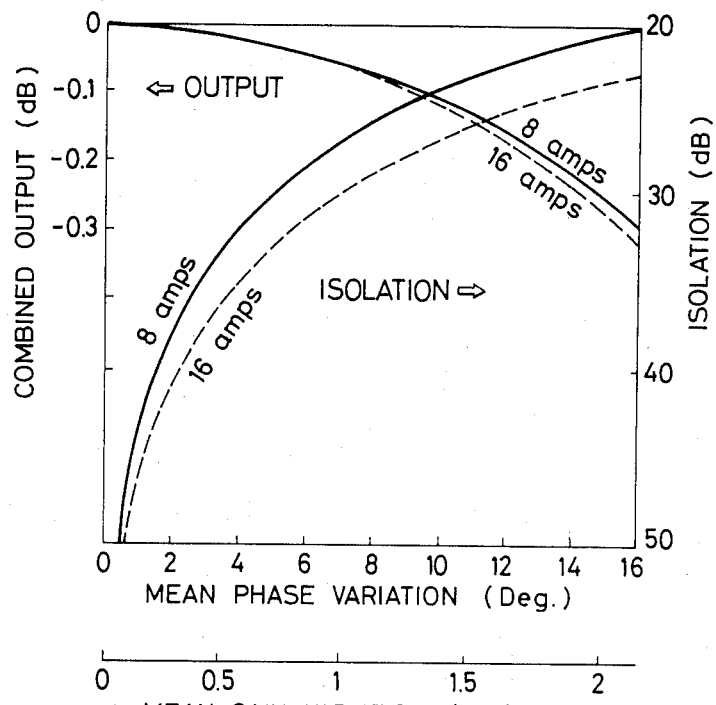
FIG. 10 is a graph showing the relationships of combined output and isolation to deviations of gain and phase shift.

FIG. 10 shows the relationships of deviations of the gain and the phase shift to the combined output (in dB) and the isolation (in dB) in the cases where n=3 and n=4, that is, where eight and 16 amplifiers are employed, respectively. Since deviations of the phase shift and the gain of an amplifier having a gain of about 20 dB can easily be reduced less than 10° and less than 1 dB, respectively, it is considered easy to implement such characteristics that isolation is 20 odd dB or more and a decrease in the combined output is below 0.3 dB.

(e) Influences of Failure of Amplifiers

Malfunction of any one or more of the amplifiers $2_1$ to $2_N$ will degrade the balance of the amplitudes of the respective amplifier outputs, resulting in the degradation of both the combined output and isolation. Now, a description will be given of the influence of malfunction of one of the N amplifiers $2_1$ to $2_N$. Letting the combined output of all the amplifiers that are in order be represented by $P_0$, the combined output of one of the amplifier that is out of order be represented by $P_{out}$ and the output at each isolate terminal be represented by $P_{iso}$ in the latter case, the reduction of the combined output is given from Eq. (24), with the output of the malfunctioning amplifier set to zero, as follows:

$$P_{out}/P_o = [(N-1)/N]^2 \quad (31)$$

For all the other output terminals, isolation is given by the following equation:

$$P_{iso}/P_o = (1/N)^2 \quad (32)$$

For instance, when N=8, malfunction of one amplifier will reduce isolation to 18.1 dB and reduce the combined output by 1.2 dB. In the case of N=16, isolation is reduced to 24 dB and the combined output is reduced by 0.6 dB. Therefore, it is preferable to use eight or more amplifiers.

Second Embodiment (M input, M outputs, N amplifiers, M<N)

Figure 11:
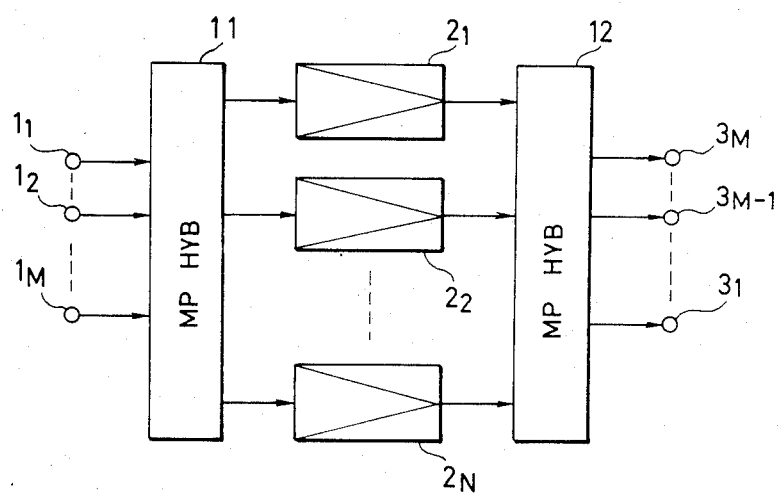
FIG. 11 is a block diagram illustrating a second embodiment (M inputs, M outputs and N amplifiers) of the power amplifying apparatus of the present invention.
Figure 12:
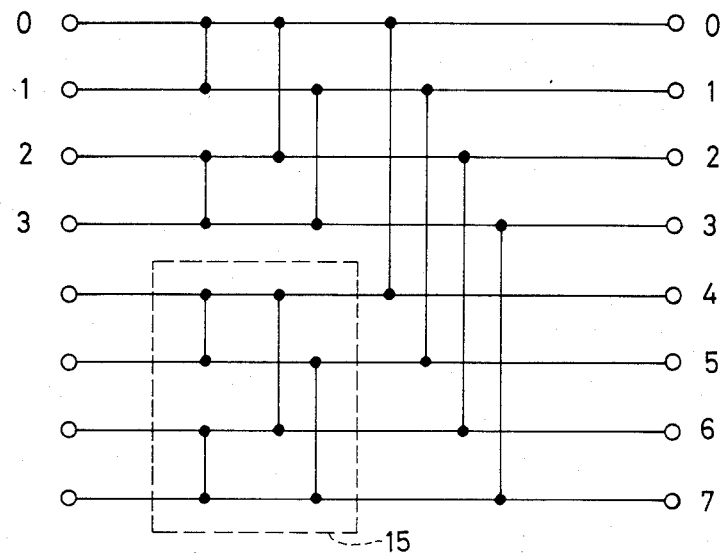
FIG. 12 is a schematic diagram showing an example of a multi-port hybrid coupler used in FIG. 11.

FIG. 11 illustrates a second embodiment of the present invention, which is identical in construction with the embodiment of FIG. 3 except that it employs M (smaller than N) input terminals $1_1$ to $1_M$ and M output terminals $3_1$ to $3_M$. As a result of this change in the number of terminals, the multi-port hybrid coupler 11 has M input terminals and N output terminals, while the multi-port hybrid coupler 12 has N input terminals and M output terminals. FIG. 12 illustrates, using the symbol shown in FIG. 4, an example of the arrangement of such a multi-port hybrid coupler in the case where N=8 and M=4. Since input signals from input terminals 0, 1, 2 and 3 on the left-hand side in FIG. 12 do not pass through hybrid couplers surrounded by the broken line 15, these hybrid couplers can be dispensed with. This embodiment can also employ the principles of operation described previously with regard to FIG. 3 and produces a simple-structured and light weight circuit arrangement resulting from the omission of unnecessary hybrid couplers.

Figure 13:
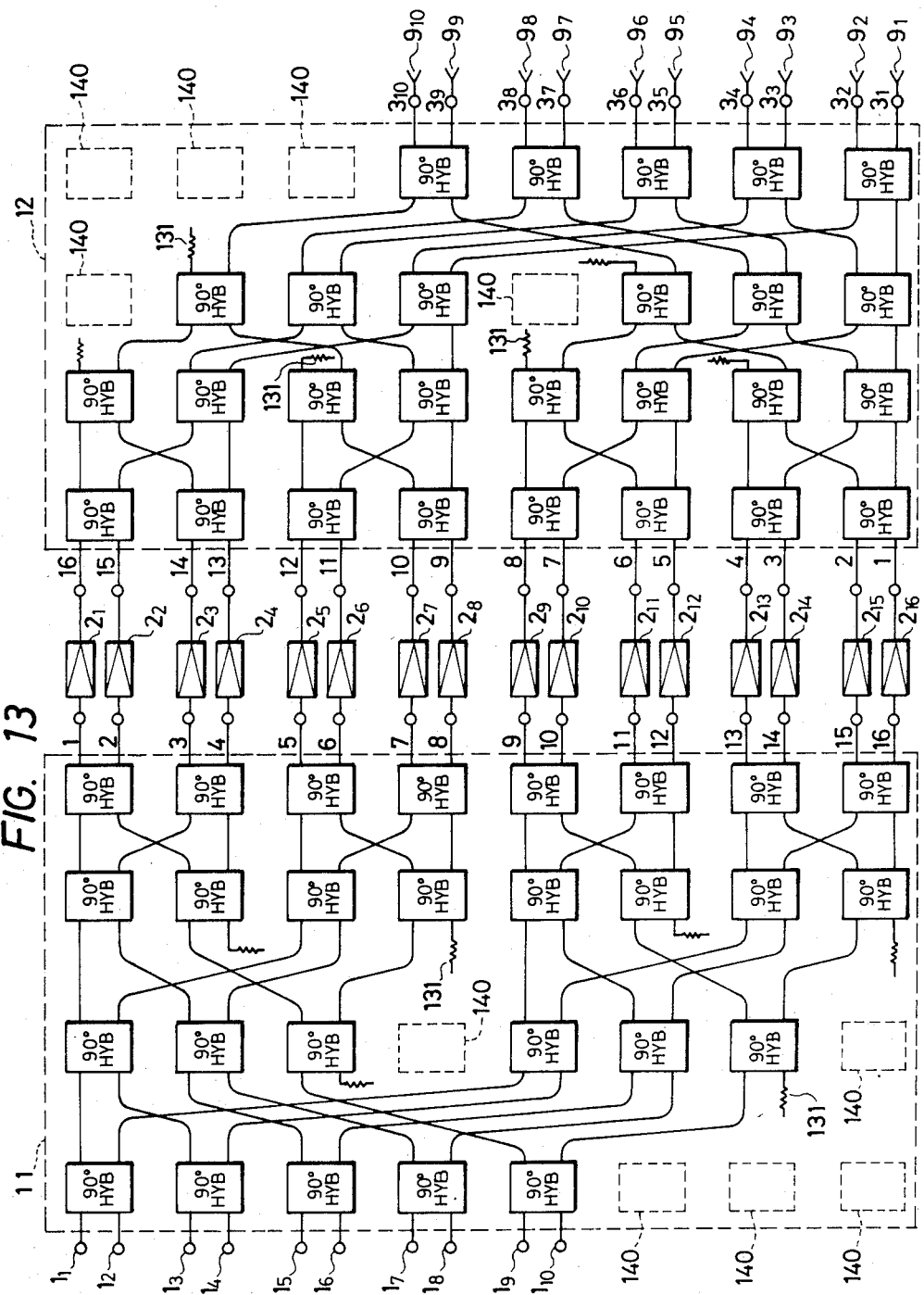
FIG. 13 is a block diagram illustrating this invention apparatus with 10 inputs, 10 outputs and 16 amplifiers.

FIG. 13 illustrates the embodiment of FIG. 11 in the case where N=16 and M=10. In the multi-port hybrid coupler 11, since the number of amplifiers to be connected thereto is N=16=$2^4$, n=4, so the number of stages of hybrid couplers is four. Since the number of input terminals is M=10, the first stage includes a first column of five hybrid couplers as shown in FIG. 13 and the number of hybrid couplers forming the fourth stage is $2^{4-1}$=8. The hybrid couplers 140 indicated by broken line boxes are not used. The hybrid couplers 140 which do not serve as signal paths between the first and fourth stages are omitted, and a dummy load 131 is connected to each of the unused input and output terminals of the hybrid couplers in the multi-port hybrid couplers 11 and 12.

The multi-port hybrid coupler 12 is identical in construction with and symmetrical with the multi-port hybrid coupler. The output terminals of the multi-port hybrid coupler 11 are numbered 1 to 16 from the top to the bottom in FIG. 13 and the amplifiers $2_1$ to $2_{16}$ are connected to the corresponding output terminals 1 to 16, respectively. The input terminals of the multi-port hybrid coupler 12 are numbered 1 to 16 from the bottom to the top and connected to the outputs of the amplifiers 16, 15, . . . , 1, respectively. That is, the multi-port hybrid coupler 12 is obtained by rotating the multi-port hybrid coupler 11 around the amplifiers $2_1$ to $2_{16}$ by 180°. Thus, the output terminals 1 to 16 of the rotated multi-port hybrid coupler 11 are used as input terminals to the outputs of the amplifiers 16, 15, . . . , 1. The input terminals $1_2$ to $1_{10}$ of the rotated multi-port hybrid coupler 11 are used as the output terminals $3_1$ to $3_{10}$.

Third Embodiment (Control of output terminals by phase shifters)

Figure 14:
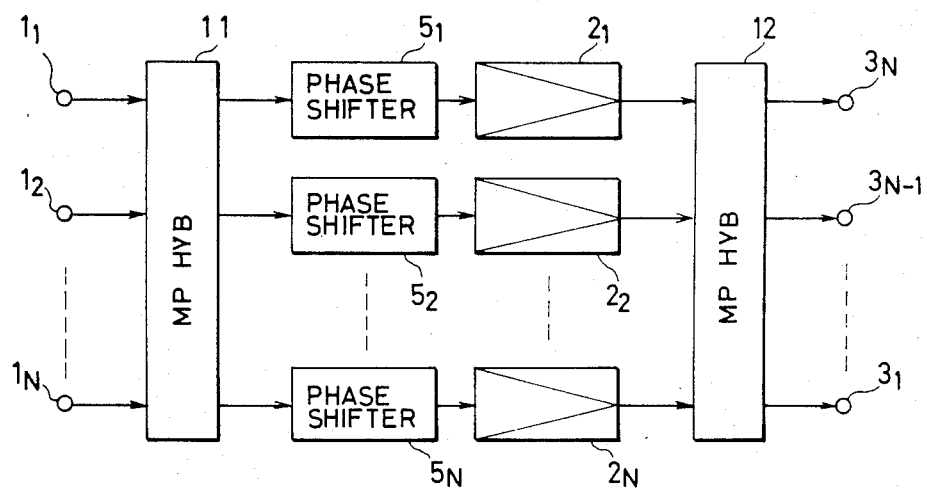
FIG. 14 is a block diagram illustrating a third embodiment of the present invention which is adapted to permit control of output terminals by phase shifters.

FIG. 14 illustrates a third embodiment of the present invention, which is identical in construction with the embodiment of FIG. 3 except that phase shifters $5_1$ to $5_N$ are connected in series to the input sides of the amplifiers $2_1$ to $2_N$, respectively. In FIG. 14, letting the phase shifts of the phase shifters $5_1$ to $5_N$ be represented by $Q_0$ to $Q_{N-1}$, power $P_{mk}$ at a kth terminal on the output side of the multi-port hybrid coupler 12 for input power $P_m$ to an mth terminal on the input side of the multi-port hybrid coupler 11 is given by the following equation, as is the case with Eq. (17):

$$P_{mk} = \frac{a^2 P_m}{N^2} \left| \sum_{h=0}^{N-1} \exp\left[ j\frac{\pi}{2} \sum_{i=0}^{n-1} (r_i \oplus s_i + r_i \oplus t_i) + j\theta_h \right] \right|^2 \quad (33)$$

When the phase shifts $\theta_0$ to $\theta_{N-1}$ are all equal, Eq. (33) agrees with Eq. (16), and so this embodiment performs the same operation as does the embodiment of FIG. 3. By changing the phase shifts $\theta_0$ to $\theta_{N-1}$, it is possible to change the relationships of connection between the input terminals and the output terminals at which are derived signals applied to the input terminals. Supposing N=4 in Eq. (33), when $\theta_0=\theta_1=\theta_2=\theta_3=0$, inputs from the input terminals $1_1$, $1_2$, $1_3$ and $1_4$ are derived at the output terminals $3_4$, $3_3$, $3_2$ and $3_1$, respectively, and when $\theta_0=\theta_2=0$ and $\theta_1=\theta_3=\pi$, the inputs from the input terminals $1_1$, $1_2$, $1_3$ and $1_4$ are derived at the output terminals $3_3$, $3_4$, $3_1$ and $3_2$, respectively. By selectively using 0 and $\pi$ for the phase shifts $Q_0$ to $Q_{N-1}$ in this way, it is possible to modify the correspondency between the input terminals and the output terminals. Also in the arrangement of employing multi-port hybrid couplers having input and output terminals of different numbers as shown in FIG. 11, the relationship of correspondence between the input and output terminals can be modified through use of phase shifters.

Effects of the Invention

Figure 15:
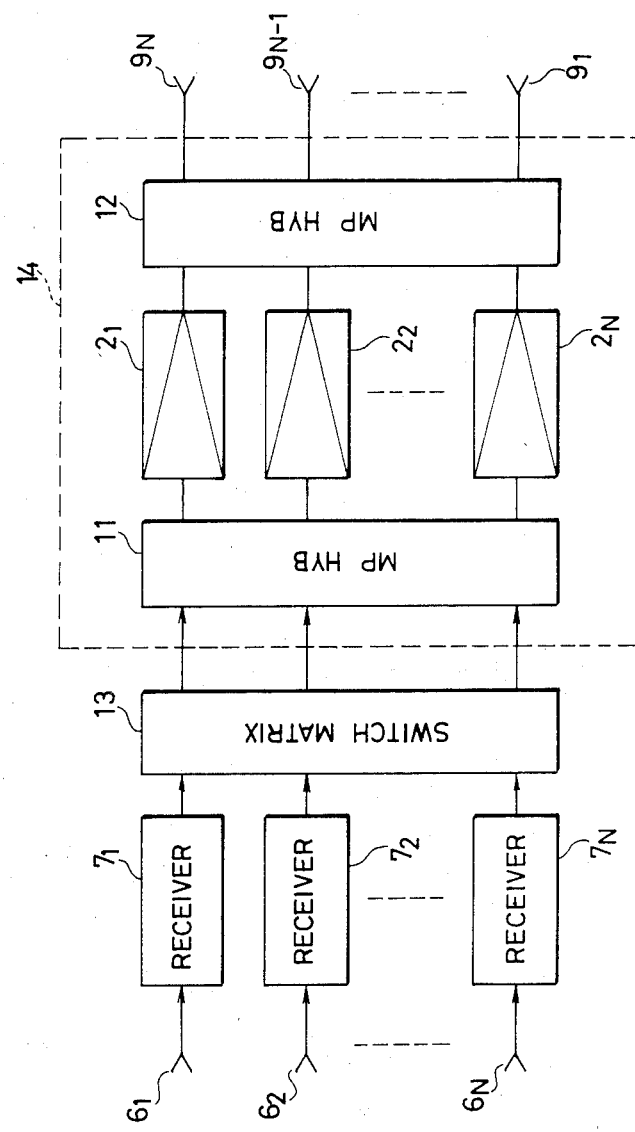
FIG. 15 is a block diagram illustrating a multi-beam satellite communication transponder system employing this invention apparatus.

To demonstrate the effect of the present invention, a description will be given, with reference to FIG. 15, of an application of this invention apparatus to a transponder system for the multi-beam satellite communication system. FIG. 15 illustrates the satellite transponder system, in which receiving antennas $6_1$ to $6_N$ covering different areas are connected to receivers $7_1$ to $7_N$, respectively, the outputs of which are, in turn, connected to a switching matrix 13 for connecting the received signals to desired destinations. The output side of the switching matrix 13 is connected to the multi-port hybrid coupler 11 in the power amplifying apparatus 14 of the present invention. The multi-port hybrid coupler 12 has its output terminals connected to transmitting antennas $9_1$ to $9_N$, respectively.

Signals received by the receiving antennas $6_1$ to $6_N$ are applied to the receivers $7_1$ to $7_N$, respectively, and then switched by the switching matrix 13 according to destination. The outputs of the switching matrix 13 are amplified by the power amplifying apparatus 14, thereafter being transmitted from the transmitting antennas $9_1$ to $9_N$ to respective destinations. With such a system, the amount of transmission traffic to each area varies with time and the signals from many receivers may sometimes be provided to one transmitting antenna, in which case a large output is required. According to the present invention, however, the signals from many receivers are distributed to and amplified by the amplifiers $2_1$ to $2_N$, and at this time, the outputs to the other transmitting antennas decrease. That is, the received signals are not centered on one amplifier alone but are amplified equally by all the amplifiers. Accordingly, it is necessary only that N equal outputs divided from the sum of the outputs to the transmitting antennas be provided to the respective amplifiers, by which the maximum output of each amplifier can be reduced smaller than the maximum output that is applied to one transmitting antenna. Moreover, the outputs to the transmitting antennas $9_1$ to $9_N$ can freely be changed by changing the inputs to the multi-port hybrid coupler 11.

Furthermore, according to the present invention, since the multi-port hybrid couplers 11 and 12 are each formed by hybrid couplers alone and do not include fixed phase shifters, their hardware arrangement is smaller than in the case of using the Butler matrix circuit. The 90° hybrid coupler is operable over a wide band, as known in the art, and accordingly, the multi-port hybrid coupler formed by such 90° hybrid couplers, without using fixed phase shifters, operates over a very wide band. In other words, when carrier frequencies allotted to beams in the multi-beam satellite communication system extend over a wide band, the present invention can be applied to an amplifying apparatus on the transmitting side of the satellite transponder system.

Besides, according to the present invention, since at least four amplifiers are used, even if their gains and phase shifts somewhat scatter, sufficient isolation can be obtained and so the amplifiers can be obtained easily and at low cost, and the isolation is not greatly affected by aging of their gain and phase shift characteristics. Further, even if one of the amplifiers is out of order, the level of the combined output does not greatly lower and isolation is not greatly degraded. In view of the above, it is desirable that the number of amplifiers be eight or more, preferably, 16 or more.

According to the present invention, even if the numbers of input terminals and output terminals are relatively small, for example, four or five, the influence of malfunction of one amplifier can be lessened by increasing the number of amplifiers greater than the numbers of the input and output terminals. By using solid-state amplifying elements formed by transistors, large outputs can be obtained at the output terminals even if the output of each amplifier is small.

Similarly, the abovementioned effects are obtainable with the embodiment of N-amplifier, M-input, M-output amplifying apparatus. For example, in the case of FIG. 13 illustrating the arrangement of a 16-amplifier, 10-input, 10-output amplifying apparatus, when one of the 16 amplifiers $2_1$ to $2_{16}$ is out of order, the combined output decreases 12%, that is, the maximum allowable number of carriers decreases 12%, but no complete failure occurs in any particular beam. On the other hand, isolation lowers to 24 dB, but the same frequency slot can be used by different beams.

It will be apparent that many modifications and variations may be effected without departing from the scope of the novel concepts of the present invention.

What is claimed is:

1. A power amplifying apparatus comprising:
 a first multi-port hybrid coupler having M input terminals and N output terminals and formed by n stages of 90° hybrid couplers alone, the first of said stages including the number, M/2, of 90° hybrid couplers, the nth stage including the number, $2^{n-1}$, of 90° hybrid couplers, and the first through nth stages of said 90° hybrid couplers being operative to distribute a signal input to any one of said M input terminals equally to said N output terminals, where $N > M$, $N = 2^n$, n is an integer that is at least equal to 2, and M/2 represents an integer having any decimal value of M/2 raised to a unit;
 N amplifiers connected directly to respective ones of said N output terminals of said first multi-port hybrid coupler;
 a second multi-port hybrid coupler having N input terminals connected to the output sides of respective ones of said N amplifiers, said second multi-port hybrid coupler having M output terminals and being formed by n stages of 90° hybrid couplers alone, the first stage in said second hybrid coupler including the number, $2^{n-1}$, of 90° hybrid couplers, the nth stage in said second hybrid coupler including the number, M/2, of 90° hybrid couplers, and the first through nth stages of said 90° hybrid couplers of said second multi-port hybrid coupler being operative to combine the distributed signal components input to said N input terminals into one at the one of said M output terminals of said second multi-port hybrid coupler which corresponds to the one of said M input terminals of said first multi-port hybrid coupler; and
 dummy loads connected to unused ones of said input and output terminals of the 90° hybrid couplers in said first and second multi-port hybrid couplers.

2. A power amplifying apparatus according to claim 1 wherein N switchable phase shifters are inserted between the N output terminals of said first multi-port hybrid coupler and the input sides of said N amplifiers for delaying the phases of the distributed signal components selectively by zero and 180°, whereby the input/output correspondency between the M input terminals of said first multi-port hybrid coupler and the M output terminals of said second multi-port hybrid coupler can be changed.

3. A power amplifying apparatus according to claim 1 or 2, further comprising:
 receiver means for receiving a communication signal from receiving antenna means, and switch matrix means inserted between the output side of said receiver means and the M input terminals of said first multi-port hybrid coupler for selectively connecting the output of said receiver means to desired ones of the M input terminals of said first multi-port hybrid coupler, the M output terminals of said second multi-port hybrid coupler being connected to M transmitting antennas, respectively.

4. A power amplifying apparatus comprising:
 a first multi-port hybrid coupler having N input terminals and N output terminals and formed by n stages of 90° hybrid couplers alone, each of said n stages including the number, $2^{2-1}$, of 90° hybrid couplers, and the first through nth stages of the 90° hybrid couplers being operative to distribute a signal input to any one of the N input terminals equally to the N output terminals thereof, where $N = 2^n$ and n is an integer that is at least equal to 2;
 a second multi-port hybrid coupler having N input terminals and N output terminals and formed by n stages of 90° hybrid couplers alone, each of said n stages of said second multi-port hybrid coupler including the number, $2^{n-1}$, of 90° hybrid couplers, and the first through nth stages of the 90° hybrid couplers of said second multi-port hybrid coupler being operative to combine distributed component signals input to the respective N input terminals thereof into one at one of the N output terminals thereof;

N switchable phase shifters connected between the N output terminals of said first multi-port hybrid coupler and the N input terminals of said second multi-port hybrid coupler for delaying phases of the distributed signal components input thereto selectively by 0° and 180°, whereby the input/output correspondency between the N input terminals of said first multi-port hybrid coupler and the N output terminals of said second multi-port hybrid coupler can be changed; and N amplifiers connected in series between the output sides of said N switchable phase shifters and the N input terminals of said second multi-port hybrid coupler.

5. A power amplifying apparatus comprising:

receiver means for receiving a signal from receiving antenna means;

a first multi-port hybrid coupler having N input terminals and N output terminals and formed by n stages of 90° hybrid couplers alone, each of said n stages including the number, $2^{n-1}$, of 90° hybrid couplers, and the first to nth stages of the 90° hybrid couplers distributing a signal input to any one of the N input terminals equally to the N output terminals, where $N=2^n$ and n is an integer that is at least equal to 2;

switch matrix means connected between the output of said receiver means and the N input terminals of said first multi-port hybrid coupler for selectively connecting the output of said receiver means to desired ones of the N input terminals of said first multi-port hybrid coupler;

N amplifiers connected to the respective N output terminals of said first multi-port hybrid coupler; and a second multi-port hybrid coupler having N input terminals connected to the respective output sides of said N amplifiers, and having N output terminals connected to N transmitting antennas, said second multi-port hybrid coupler being identical in construction with said first multi-port hybrid coupler, the N input terminals of said second multi-port hybrid coupler corresponding to the N output terminals of said first multi-port hybrid coupler in reverse order of arrangement thereof.

6. A power amplifying apparatus according to claim 5 including N switchable phase shifters between the N output terminals of said first multi-port hybrid coupler and the inputs of said N amplifiers for delaying phases of the distributed signal components selectively by zero and 180°, whereby the input/output correspondency between the N input terminals of said first multi-port hybrid coupler and the N output terminals of said second multi-port hybrid coupler can be changed.

7. A power amplifying apparatus according to claim 5 wherein N is at least equal to 8.

* * * * *

REEXAMINATION CERTIFICATE (3096th)

United States Patent [19]
Egami et al.

[11] B1 4,618,831
[45] Certificate Issued Jan. 7, 1997

[54] POWER AMPLIFYING APPARATUS

[75] Inventors: Shunichiro Egami, Yokosuka; Makoto Kawai, Yokohama, both of Japan

[73] Assignee: Nippon Telegraph & Telephone Corporation, Tokyo, Japan

Reexamination Request:
No. 90/004,146, Feb. 15, 1996

Reexamination Certificate for:
Patent No.: 4,618,831
Issued: Oct. 21, 1986
Appl. No.: 775,976
Filed: Sep. 13, 1985

[30] Foreign Application Priority Data
Sep. 25, 1984 [JP] Japan ............... 59-200959

[51] Int. Cl.$^6$ ............... H03F 3/68
[52] U.S. Cl. ............... 330/124 R; 330/53; 330/124 D; 330/295; 333/117; 455/133; 455/140
[58] Field of Search ............... 330/53, 124 R, 330/124 D, 286, 287, 295, 147, 148; 333/117, 121; 342/373, 374; 455/133–140

[56] References Cited

U.S. PATENT DOCUMENTS

| | | | |
|---|---|---|---|
| 3,480,885 | 11/1969 | Schrank | 330/124 R |
| 3,731,217 | 5/1973 | Gerst et al. | 330/56 |
| 4,259,741 | 3/1981 | Kawai | 455/12 |
| 4,477,781 | 10/1984 | Reuss, Jr. | 330/286 |

OTHER PUBLICATIONS

Kawai, Suzuki and Egami, "Concept of Mutliport–Coupling Beam–Switching Network and its Basic Performance in K–Band", Electronic Letters, 10th Nov. 1983, vol. 19, No. 23, pp. 990–991.

Kawai, M., "Multiport–Coupling Beam–Switching Network for Satellite Use" Transactions Inst. of Electronics & Communication Eng. of Japan, Mar. 1983, vol. J66–B, No. 3.

English Translation, Kawai, M., "Multiport–Coupling Beam–Switching Network for Satellite Use" Transactions Inst. of Electronics & Communication Eng. of Japan, Mar. 1983, vol. J66–B, No. 3.

*Primary Examiner*—James B. Mullins

[57] ABSTRACT

A first multi-port hybrid coupler is formed by $n2^{n-1}$ (where n is an integer equal to or greater than 2) hybrid couplers alone, which are divided into n stages, each including $2^{n-1}$ hybrid couplers. A signal input to any one of N ($-2^n$) input terminals of the first stage is distributed equally to N output terminals of the nth stage. The N output terminals of the nth stage of the first multi-port hybrid coupler are connected to N amplifiers at the input side thereof, respectively, and the N amplifiers are connected at the output side to a second multi-port hybrid coupler. The second multi-port hybrid coupler is identical in construction with the first multi-port hybrid coupler, but its input terminals and output terminals are reverse from those of the latter and the input terminals of the second multi-port hybrid coupler are connected to the N amplifiers in an order reverse from the order of arrangement of the output terminals of the first multi-port hybrid coupler.

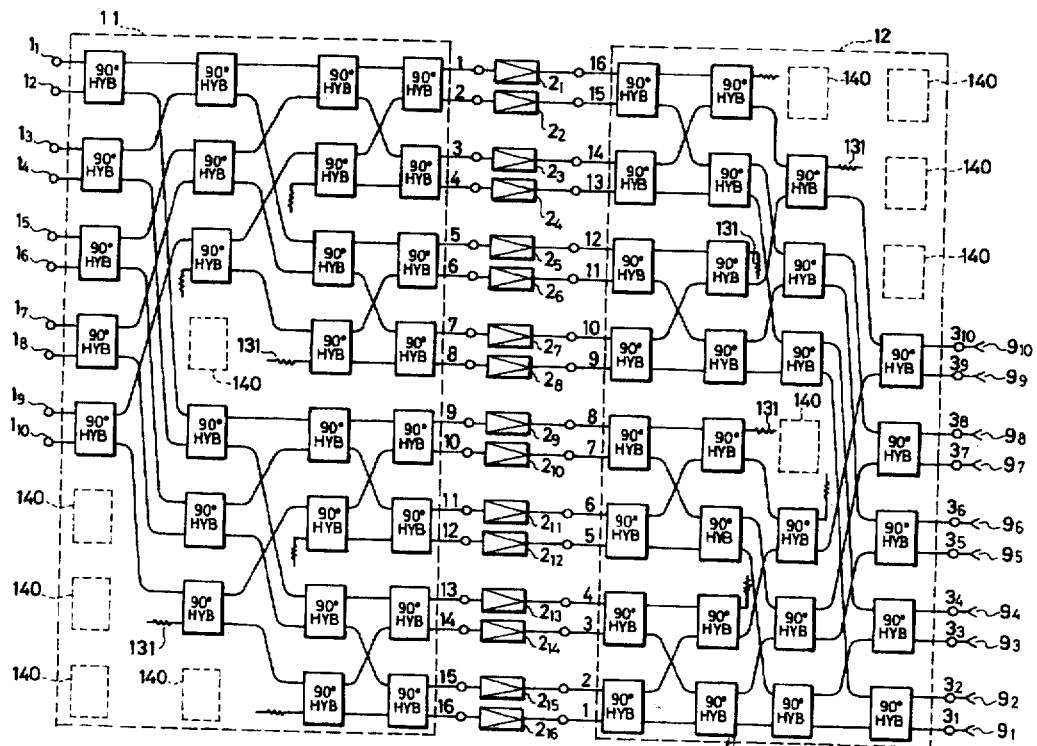

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–4 is confirmed.

Claim 5 is determined to be patentable as amended.

Claims 6 and 7, dependent on an amended claim, are determined to be patentable.

5. A power amplifying apparatus comprising:

*plural* receiver means for receiving [a signal] *signals* from receiving antenna means;

a first multi-port hybrid coupler having N input terminals and N output terminals and formed by n stages of 90° hybrid couplers alone, each of said n stages including the number, $2^{n-1}$, of 90° hybrid couplers, and the first to nth stages of the 90° hybrid couplers distributing a signal input to any one of the N input terminals equally to the N output terminals, where $N=2^n$ and n is an integer that is at least equal to 2;

switch matrix means connected between the [output] *outputs* of said receiver means and the N input terminals of said first multi-port hybrid coupler for selectively connecting the [output] *outputs* of said receiver means to desired ones of the N input terminals of said first multi-port hybrid coupler;

N amplifiers connected to the respective N output terminals of said first multi-port hybrid coupler; and a second multi-port hybrid coupler having N input terminals connected to the respective output sides of said N amplifiers, and having N output terminals connected to N transmitting antennas, said second multi-port hybrid coupler being identical in construction with said first multi-port hybrid coupler, the N input terminals of said second multi-port hybrid coupler corresponding to the N output terminals of said first multi-port hybrid coupler in reverse order of arrangement thereof.

* * * * *